United States Patent
Ota et al.

(10) Patent No.: US 9,076,742 B2
(45) Date of Patent: Jul. 7, 2015

(54) OXIDATION ANNEALING DEVICE AND METHOD FOR FABRICATING THIN FILM TRANSISTOR USING OXIDATION ANNEALING

(75) Inventors: Yoshifumi Ota, Osaka (JP); Masato Hashimoto, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 35 days.

(21) Appl. No.: 13/883,027

(22) PCT Filed: Oct. 28, 2011

(86) PCT No.: PCT/JP2011/006065
§ 371 (c)(1),
(2), (4) Date: Jul. 10, 2013

(87) PCT Pub. No.: WO2012/060079
PCT Pub. Date: May 10, 2012

(65) Prior Publication Data
US 2013/0280925 A1    Oct. 24, 2013

(30) Foreign Application Priority Data
Nov. 5, 2010  (JP) .................................. 2010-248647

(51) Int. Cl.
| | | |
|---|---|---|
| C23C 16/00 | (2006.01) | |
| H01L 21/469 | (2006.01) | |
| H01L 21/00 | (2006.01) | |
| H01L 21/324 | (2006.01) | |

(Continued)

(52) U.S. Cl.
CPC ........ *H01L 21/324* (2013.01); *H01L 21/67115* (2013.01); *H01L 21/67178* (2013.01); *H01L 21/6719* (2013.01); *H01L 29/7869* (2013.01); *H01L 21/477* (2013.01)

(58) Field of Classification Search
CPC ............ H01L 21/67115; H01L 21/178; H01L 21/477; H01L 21/324; H01L 21/6719; H01L 29/7869
USPC ............. 438/799, 778; 118/715; 257/E21.09; 427/532, 469; 219/121.21, 121.43, 86
See application file for complete search history.

(56) References Cited

U.S. PATENT DOCUMENTS

| | | | |
|---|---|---|---|
| 2006/0223328 A1 | 10/2006 | Utsunomiya et al. | |
| 2007/0190744 A1* | 8/2007 | Hiraiwa et al. | ............... 438/424 |

(Continued)

FOREIGN PATENT DOCUMENTS

| | | |
|---|---|---|
| CN | 1881545 A | 12/2006 |
| CN | 101681817 A | 3/2010 |

(Continued)

OTHER PUBLICATIONS

Official Communication issued in International Patent Application No. PCT/JP2011/006065, mailed on Dec. 6, 2011.

*Primary Examiner* — Julio J Maldonado
*Assistant Examiner* — Moazzam Hossain
(74) *Attorney, Agent, or Firm* — Keating & Bennett, LLP

(57) ABSTRACT

A far-infrared plane heater 6 is placed in a closed-container-shaped device body 3 of an oxidation annealing device 1, an oxygen addition gas feed pipe 8 through which an oxygen addition gas containing water vapor and oxygen is fed into the device body 3 is connected to a gas exhaust pipe 11 through which gas in the device body 3 is discharged, and jet nozzles 16 through which the oxygen addition gas containing water vapor and oxygen is ejected to an oxygen-deficient portion of a substrate 50 are brought into communication with the oxygen addition gas feed pipe 8. This allows oxidation annealing of a large substrate at high throughput and low cost while preventing a leakage current.

4 Claims, 6 Drawing Sheets

(51) Int. Cl.
*H01L 21/67* (2006.01)
*H01L 29/786* (2006.01)
*H01L 21/477* (2006.01)

(56) References Cited

U.S. PATENT DOCUMENTS

2010/0107977 A1* 5/2010 Kasai et al. ............... 118/667
2010/0139762 A1 6/2010 Ohmi et al.
2011/0008930 A1* 1/2011 Sasaki et al. ............... 438/104
2011/0068334 A1* 3/2011 Yamazaki et al. ............ 257/43

FOREIGN PATENT DOCUMENTS

| JP | 06-267840 A | 9/1994 |
| JP | 3066387 U | 2/2000 |
| JP | 2009-128837 A | 6/2009 |

* cited by examiner

| | REGION A | | REGION B | | REGION C | | SEAMS Vth AVERAGE (V) | EXCEPT SEAMS Vth AVERAGE (V) | Vth DIFFERENCE |
|---|---|---|---|---|---|---|---|---|---|
| | SEAMS | EXCEPT SEAMS | SEAMS | EXCEPT SEAMS | SEAMS | EXCEPT SEAMS | | | |
| COMPARATIVE EXAMPLE | 13.5 | 8.3 | 11.9 | 7.9 | 9.8 | 7.3 | 11.7 | 7.8 | 3.9 |
| EXAMPLE | 9.4 | 7.7 | 10.0 | 7.9 | 10.3 | 7.6 | 9.9 | 7.8 | 2.1 |

US 9,076,742 B2

OXIDATION ANNEALING DEVICE AND METHOD FOR FABRICATING THIN FILM TRANSISTOR USING OXIDATION ANNEALING

TECHNICAL FIELD

The present disclosure relates to oxidation annealing devices and methods for fabricating a thin film transistor using oxidation annealing.

BACKGROUND ART

An active matrix substrate includes, e.g., thin film transistors (hereinafter also referred to as "TFTs") as switching elements, one for each pixel, which is the smallest unit of an image.

A typical bottom-gate TFT includes, for example: a gate electrode provided on an insulating substrate; a gate insulating film provided to cover the gate electrode; an island-like semiconductor layer provided on the gate insulating film to lie above the gate electrode; and a source electrode and a drain electrode provided on the semiconductor layer to face each other.

Furthermore, in recent years, for active matrix substrates, it has been proposed to use, instead of a conventional thin film transistor including a semiconductor layer of amorphous silicon, a TFT including a semiconductor layer of an oxide semiconductor that is an In—Ga—Zn—O (IGZO) oxide semiconductor with high mobility (hereinafter also referred to as an "oxide semiconductor layer") as a switching element for each pixel, which is the smallest unit of an image.

It is difficult for a thin film transistor using an oxide semiconductor to maintain high thin film transistor performance, and needs exist for controlling the amount of oxygen deficiency due to oxidation annealing and reducing the defect level.

To address this problem, for example, as described in PATENT DOCUMENT 1, process steps of a thermal oxidation annealing process from the placement of a substrate in a diffusion furnace to a heat treatment process (of increasing, stabilizing, and decreasing the furnace temperature) have been conventionally known to be performed in atmospheric gas (nitrogen, oxygen, and water vapor) in the diffusion furnace.

Furthermore, such a multistage glass substrate calcining furnace as described in PATENT DOCUMENT 2 has been known. The multistage glass substrate calcining furnace has a furnace body made of a heat insulator, and includes infrared radiation plates that are vertically arranged with an air gap formed on the inner wall of the furnace body, and between which a plane heater is sandwiched. One of the infrared radiation plates has a gas feed hole, and the other infrared radiation plate has an exhaust hole. Several infrared radiation plates between each adjacent pair of which a plane heater is sandwiched in a manner similar to that in which the plane heater is sandwiched between the right and left infrared radiation plates are horizontally arranged at a predetermined distance apart from one another, and support bars support a glass substrate in a space between each adjacent pair of the horizontal infrared radiation plates.

CITATION LIST

Patent Document

PATENT DOCUMENT 1: Japanese Patent Publication No. 2009-128837

PATENT DOCUMENT 2: Japanese Utility Model Registration No. 3066387

SUMMARY OF THE INVENTION

Technical Problem

However, in such a batch-type horizontal diffusion furnace as described in PATENT DOCUMENT 1, with increasing substrate size, the capacity of a device body increases, and thus, it takes much time to increase or decrease the furnace temperature. It also takes much time to stabilize the furnace temperature due to overshoots. Furthermore, since the furnace temperature becomes high, the furnace cannot be made of a metal member, and must be made of a quartz member. It is very difficult to machine quartz into a large member, and thus, a large substrate cannot be accommodated. Furthermore, since a batch process is performed in the furnace, the number of substrates that can be processed, i.e., the throughput that is the furnace performance per unit time, is not increased.

The multistage glass substrate calcining furnace of PATENT DOCUMENT 2 cannot ensure its hermeticity, and thus, water vapor is distributed only immediately above a substrate, thereby making it difficult to disperse water vapor in the furnace. Furthermore, when a mica heater that is a constituent member of an infrared heater is in contact with a large amount of moisture, this leads to a leakage current.

Portions of a substrate corresponding to seams between adjacent ones of targets are formed by AC sputter deposition, and the use of IGZO causes the performance of TFTs corresponding to the portions to vary; thus, not the performance of TFTs on the entire substrate, but the performance of some of the TFTs needs to be locally improved.

It is therefore an object of the present disclosure to allow oxidation annealing of a large substrate at high throughput and low cost while preventing a leakage current.

Solution to the Problem

In order to achieve the object, in this disclosure, an oxygen addition gas containing water vapor and oxygen is fed only to an oxygen-deficient portion of a substrate.

Conversely, a nitrogen gas is blown to a portion of the substrate except the oxygen-deficient portion, i.e., an oxygen-excessive portion thereof, to reduce oxidation.

Specifically, an oxidation annealing device of a first aspect of the disclosure includes: a device body formed in a shape of a closed container; a far-infrared plane heater placed in the device body; an oxygen addition gas feed pipe through which an oxygen addition gas containing water vapor and oxygen is fed into the device body; a gas exhaust pipe through which gas in the device body is discharged; and jet nozzles that are brought into communication with the oxygen addition gas feed pipe and through which the oxygen addition gas containing water vapor and oxygen is ejected to an oxygen-deficient portion of a substrate.

With the configuration, a large substrate is efficiently heated in the device body using the far-infrared plane heater. Furthermore, since the oxygen addition gas containing water vapor and oxygen is ejected through the jet nozzles only to the oxygen-deficient portion of the substrate, this prevents the interior of the device body from being filled with a larger amount of water vapor than necessary, thereby reducing the leakage current from the far-infrared plane heater (electrical breakdown). Moreover, since the oxygen gas containing water vapor is blown to the substrate to heat the substrate, this improves the oxidation efficiency to eliminate the need for maintaining the interior of the device body at a high temperature of about 450° C., and thus, the device body can be made of metal. In addition, the oxygen addition gas needs to be brought into contact with only the oxygen-deficient portion, the interior of the device body does not need to be entirely and uniformly filled with the oxygen addition gas, and thus, high hermeticity is not required. This allows vapor oxidation annealing of a large substrate.

According to a second aspect of the disclosure, the oxidation annealing device of the first aspect of the disclosure may further include: a nitrogen gas feed pipe configured to fill a space in the device body with a nitrogen gas, and the oxygen addition gas may be ejected through the jet nozzles with the device body filled with the nitrogen gas.

With the configuration, the oxygen addition gas containing water vapor and oxygen is ejected through the jet nozzles only to the oxygen-deficient portion of the substrate, thereby accelerating oxidation. However, since the interior of the device body is filled with nitrogen, this reduces oxidation of a portion of the substrate that does not require oxygen, and prevents the interior of the device body from being filled with a larger amount of water vapor than necessary, thereby reducing the leakage current from the far-infrared plane heater (electrical breakdown).

According to a third aspect of the disclosure, in the first or second aspect of the disclosure, the substrate may correspond to a thin film transistor, and the oxygen-deficient portion may be a portion of the substrate corresponding to a seam between targets and formed by AC sputtering.

With the configuration, even when TFTs on the portion of the substrate corresponding to the target seam and formed by AC sputtering deposition vary in performance, the oxygen addition gas containing water vapor and oxygen is ejected to the portion corresponding to the target seam to locally improve the performance.

According to a fourth aspect of the disclosure, in the third aspect of the disclosure, the seam may include a plurality of seams, and the jet nozzles may be arranged depending on the number of the seams.

With the configuration, the jet nozzles may be arranged depending on portions of the substrate corresponding to the target seams and needing to be oxidized, thereby simplifying the device.

An oxidation annealing device of a fifth aspect of the disclosure includes: a device body formed in a shape of a closed container; a far-infrared plane heater placed in the device body; a nitrogen gas feed pipe through which a nitrogen gas is fed into the device body; a gas exhaust pipe through which gas in the device body is discharged; and jet nozzles that are brought into communication with the nitrogen gas feed pipe and through which the nitrogen gas is ejected to an oxygen-excessive portion of a substrate.

With the configuration, a large substrate is efficiently heated in the device body using the far-infrared plane heater. In this aspect of the disclosure, conversely, the nitrogen gas serving to reduce oxidation is ejected through the jet nozzles only to the oxygen-excessive portion of the substrate to provide uniform oxidation of the entire substrate. In this method, the interior of the device body is not filled with water vapor, thereby reducing the leakage current from the far-infrared plane heater (electrical breakdown). In addition, the nitrogen gas needs to be brought into contact with only the oxygen-excessive portion, the interior of the device body does not need to be entirely and uniformly filled with the nitrogen gas, and thus, high hermeticity is not required. This allows vapor oxidation annealing of a large substrate.

According to a sixth aspect of the disclosure, in the fifth aspect of the disclosure, the substrate may correspond to a thin film transistor, and the oxygen-excessive portion may be a portion of the substrate except a portion of the substrate corresponding to a seam between targets and formed by AC sputtering.

With the configuration, even when TFTs on the portion of the substrate corresponding to the target seam and formed by AC sputtering deposition vary in performance, the nitrogen gas is ejected to the portion of the substrate except the portion corresponding to the target seam to reduce oxidation, and thus, performance variations can be generally improved.

According to a seventh aspect of the disclosure, in any one of the first through sixth aspects of the disclosure, the far-infrared plane heater may include a mica heater and a flat infrared radiation plate.

With the configuration, when the far-infrared plane heater is made of mica, this facilitates shaping the heater of a size large enough to accommodate a large substrate, and allows the speed of response of the heater to be high.

A method for fabricating a thin film transistor using oxidation annealing according to an eighth aspect of the disclosure includes: while heating a substrate in a device body using a far-infrared plane heater, locally ejecting an oxygen addition gas containing water vapor and oxygen to an oxygen-deficient portion of the substrate.

With the configuration, a large substrate is efficiently heated in the device body using the far-infrared plane heater. Furthermore, since the oxygen addition gas containing water vapor and oxygen is ejected through the jet nozzles only to the oxygen-deficient portion of the substrate, this prevents the interior of the device body from being filled with a larger amount of water vapor than necessary, thereby reducing the leakage current from the far-infrared plane heater (electrical breakdown). Moreover, since the oxygen gas containing water vapor is blown to the substrate to heat the substrate, this improves the oxidation efficiency to eliminate the need for maintaining the interior of the device body at a high temperature of about 450° C., and thus, the device body can be made of metal. In addition, the oxygen addition gas needs to be brought into contact with only the oxygen-deficient portion, the interior of the device body does not need to be entirely and uniformly filled with the oxygen addition gas, and thus, high hermeticity is not required. This allows vapor oxidation annealing of a large substrate.

A method for fabricating a thin film transistor using oxidation annealing according to a ninth aspect of the disclosure includes: while heating a substrate using a far-infrared plane heater with a device body filled with a nitrogen gas, locally ejecting an oxygen addition gas containing water vapor and oxygen to an oxygen-deficient portion of the substrate.

With the configuration, a large substrate is efficiently heated in the device body using the far-infrared plane heater. The oxygen addition gas containing water vapor and oxygen is ejected through the jet nozzles only to the oxygen-deficient portion of the substrate, thereby accelerating oxidation. However, since the interior of the device body is filled with nitrogen, this reduces oxidation of a portion of the substrate that does not require oxygen, and prevents the interior of the device body from being filled with a larger amount of water vapor than necessary, thereby reducing the leakage current from the far-infrared plane heater (electrical breakdown). Moreover, since the oxygen gas containing water vapor is blown to the substrate to heat the substrate, this improves the oxidation efficiency to eliminate the need for maintaining the interior of the device body at a high temperature of about 450° C., and thus, the device body can be made of metal. In addition, the oxygen addition gas needs to be brought into contact with only the oxygen-deficient portion, the interior of the device body does not need to be entirely and uniformly filled with the oxygen addition gas, and thus, high hermeticity is not required. This allows vapor oxidation annealing of a large substrate.

According to a tenth aspect of the disclosure, the method of the eighth or ninth aspect of the disclosure may further include: an AC sputtering process of, before the annealing process, applying an alternating voltage having one of polarities to one of a plurality of pairs of targets arranged in parallel, and applying an alternating voltage having the other polarity to another one of the pairs adjacent to the pair, and the oxygen-deficient portion may be a portion of the substrate corresponding to a seam between targets and formed by the AC sputtering process.

With the configuration, in a process before the annealing process, even when TFTs on the portion of the substrate corresponding to the target seam and formed by AC sputtering deposition vary in performance, the oxygen addition gas containing water vapor and oxygen is ejected to the portion corresponding to the target seam to locally improve the performance.

A method for fabricating a thin film transistor using oxidation annealing according to an eleventh aspect of the disclosure may include: while heating a substrate in a device body using a far-infrared plane heater, locally ejecting a nitrogen gas to an oxygen-excessive portion of the substrate.

With the configuration, a large substrate is efficiently heated in the device body using the far-infrared plane heater. In this aspect of the disclosure, conversely, the nitrogen gas serving to reduce oxidation is ejected through the jet nozzles only to the oxygen-excessive portion of the substrate to provide uniform oxidation of the entire substrate. In this method, the interior of the device body is not filled with water vapor, thereby reducing the leakage current from the far-infrared plane heater (electrical breakdown). In addition, the nitrogen gas needs to be brought into contact with only the oxygen-excessive portion, the interior of the device body does not need to be entirely and uniformly filled with the nitrogen gas, and thus, high hermeticity is not required. This allows vapor oxidation annealing of a large substrate.

According to a twelfth aspect of the disclosure, the method of the eleventh aspect of the disclosure may further include: an AC sputtering process of, before the annealing process, applying an alternating voltage having one of polarities to one of a plurality of pairs of targets arranged in parallel, and applying an alternating voltage having the other polarity to another one of the pairs adjacent to the pair, and the oxygen-excessive portion may be a portion of the substrate except a portion of the substrate corresponding to a seam between targets and formed by the AC sputtering process.

With the configuration, even when TFTs on the portion of the substrate corresponding to the target seam and formed by AC sputtering deposition vary in performance, the nitrogen gas is ejected to the portion of the substrate except the portion corresponding to the target seam to reduce oxidation, and thus, performance variations can be generally improved.

Advantages of the Invention

As described above, according to the present disclosure, while a substrate is heated using a far-infrared plane heater, an oxygen addition gas containing water vapor and oxygen is locally ejected only to an oxygen-deficient portion of the substrate. This allows oxidation annealing of a large substrate at high throughput and low cost while preventing the leakage current.

Similarly, according to the present disclosure, while a substrate is heated using a far-infrared plane heater, a nitrogen gas is locally ejected only to an oxygen-excessive portion of the substrate. This allows oxidation annealing of a large substrate at high throughput and low cost while preventing the leakage current.

BRIEF DESCRIPTION OF THE DRAWINGS

FIGS. 5A and 5B schematically illustrate an AC sputtering device, in which FIG. 5A is a plan view of the AC sputtering device, and FIG. 5B is a cross-sectional view taken along the line Vb-Vb.

DESCRIPTION OF EMBODIMENTS

An embodiment of the present disclosure will be described hereinafter with reference to the drawings.

Figure 1:
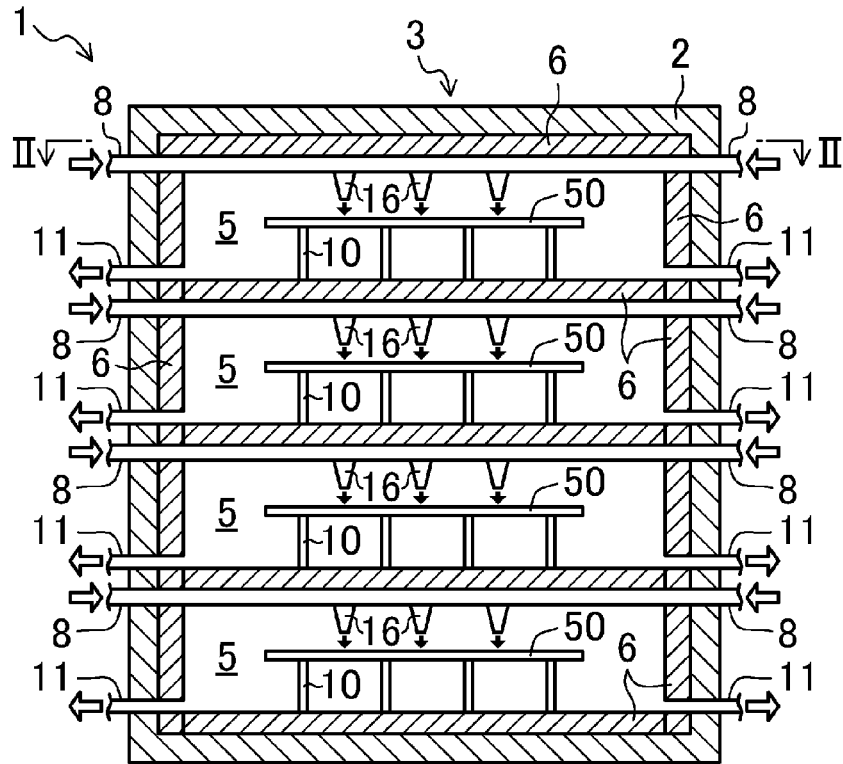
FIG. 1 is a cutaway front view of an oxidation annealing device according to an embodiment.
Figure 2:
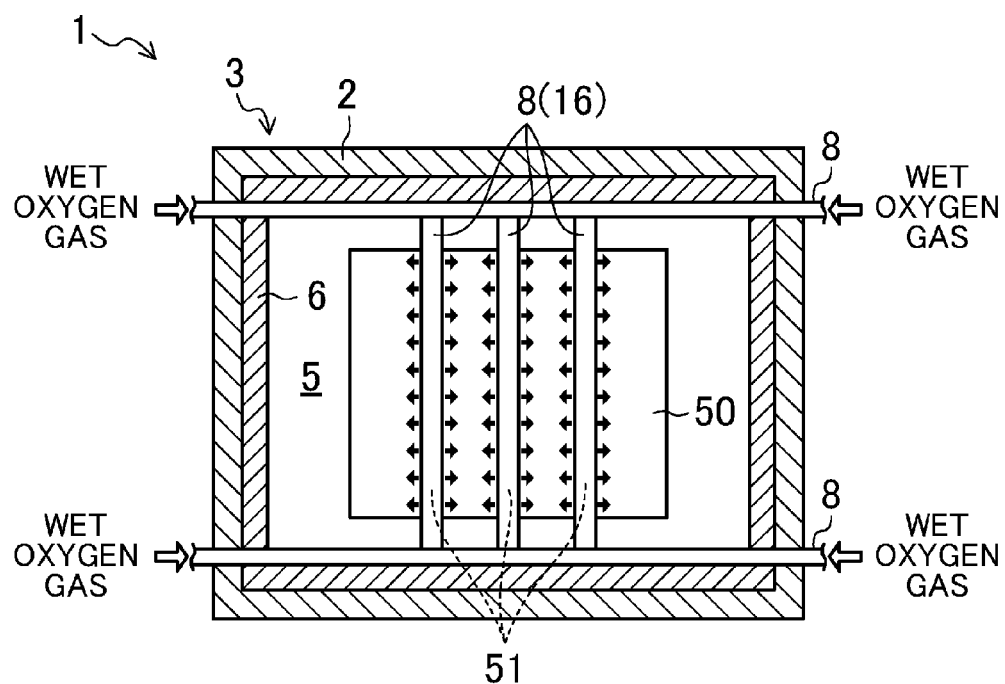
FIG. 2 is a cutaway top view of the oxidation annealing device according to the embodiment.

FIGS. 1 and 2 illustrate an oxidation annealing device 1 of the embodiment of the present disclosure, and the oxidation annealing device 1 includes a device body 3 covered with a heat insulator 2 formed in the shape of a closed container. The device body 3 is, for example, in the shape of a rectangular parallelepiped, and is vertically partitioned into four chambers 5, for example. Five far-infrared plane heaters 6 are arranged one above another, and are placed on inside top and inside bottom walls of the device body 3 and at the locations at which the device body 3 is partitioned, and other far-infrared plane heaters 6 are also placed on front, back, left, and right side walls of the device body 3. In other words, the chambers 5 are each surrounded by corresponding ones of the far-infrared plane heaters 6. The number of the chambers 5 in the device body 3 is not specifically limited, and may be one through three, or five or more.

An oxygen addition gas feed pipe 8 through which an oxygen addition gas containing water vapor and oxygen is fed is connected to the device body 3, and a front end portion of the oxygen addition gas feed pipe 8 is divided into branches, and the branches each reach a corresponding one of the chambers 5. Substrate support pins 10 are placed in each of the chambers 5 so as to be able to support a target substrate 50 for annealing at a distance apart from the far-infrared plane heaters 6. Although not shown in detail, the far-infrared plane heaters 6 each include a mica heater, and flat infrared radiation plates between which the mica heater is sandwiched. When the heater is made of mica, this facilitates shaping the heater of a size large enough to accommodate a large substrate, and allows the speed of response of the heater to be high.

Gas exhaust pipes 11 are also connected to the device body 3 to discharge gas in the device body 3, and each communicate with a corresponding one of the chambers 5 to discharge gas in the chamber 5.

Figure 3:
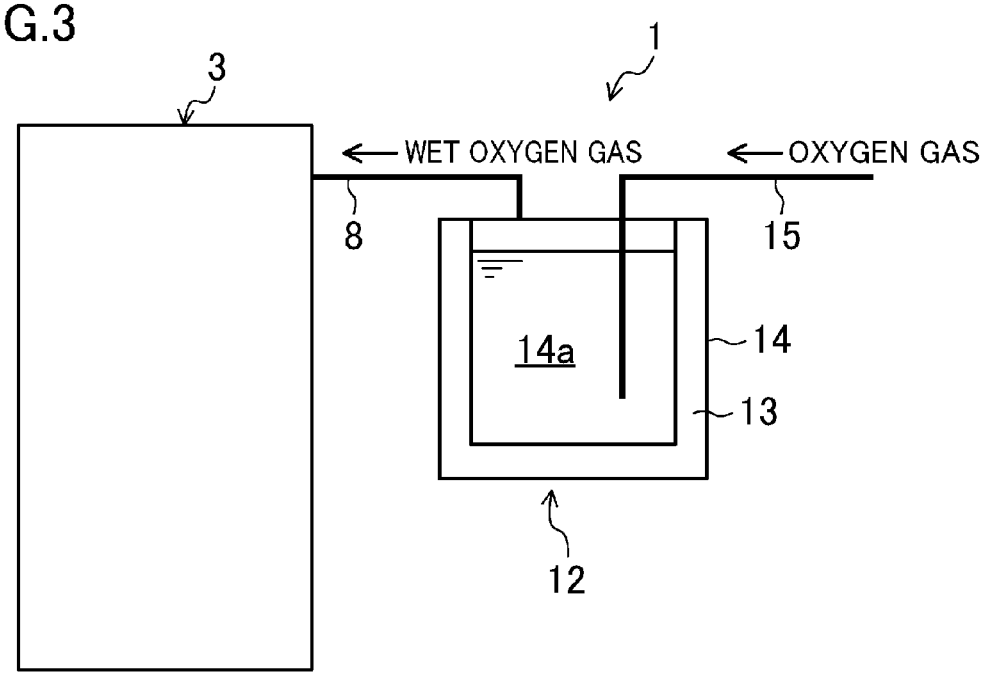
FIG. 3 is a front view schematically illustrating a bubbler system.

As illustrated in FIG. 3, the oxygen addition gas feed pipe 8 reaching the chambers 5 is connected to a bubbler system 12. The bubbler system 12 includes a hot water tank 14 including a heater 13 configured to be heated to about 90° C., and an oxygen gas is fed through, e.g., an unshown oxygen tank into an oxygen gas feed pipe 15 extending into the hot water tank 14. Thus, upper part of the hot water tank 14 is filled with oxygen fed into heated hot water 14a and water vapor, and a wet oxygen gas containing water vapor is fed into the oxygen addition gas feed pipe 8.

On the other hand, as illustrated in FIG. 1, the oxygen addition gas feed pipe 8 reaching the chambers 5 includes jet nozzles 16. As illustrated in FIG. 2, the jet nozzles 16 are configured to locally eject the oxygen addition gas containing water vapor and oxygen therethrough only to oxygen-deficient portions of the substrate 50 supported by the substrate support pins 10, i.e., portions 51 thereof corresponding to seams between adjacent ones of targets (see FIGS. 5A and 5B).

—Substrate Fabrication Process—

Figure 4:
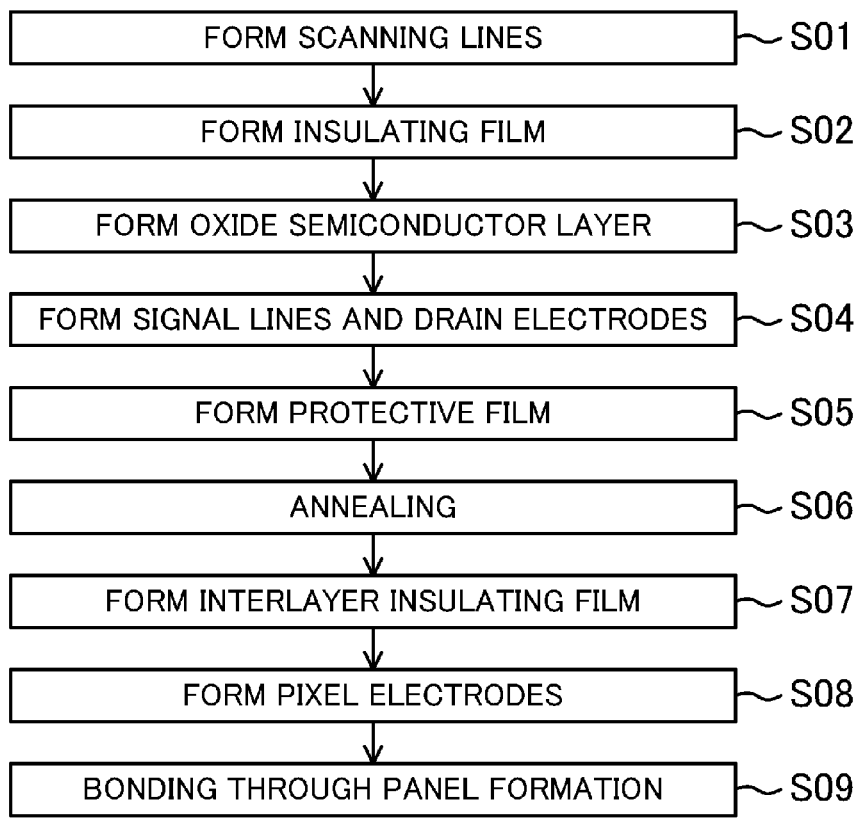
FIG. 4 is a flow chart illustrating a method for fabricating a thin film transistor using oxidation annealing.

Next, a process for fabricating a liquid crystal panel will be described with reference to FIG. 4. The process includes a method for fabricating a thin film transistor using oxidation annealing according to this embodiment.

First, in step S01, scanning lines are formed on an active matrix substrate 50. For example, a titanium layer, an aluminum layer, and a titanium layer are sequentially deposited on the active matrix substrate 50, and then, the layers are patterned by photolithography, wet etching, and resist removal and cleaning to form the scanning lines made of the three layers.

Next, in step S02, an insulating film is formed. An $SiO_2$ layer and an In—Ga—Zn—O (IGZO) layer are respectively formed as an insulating film and a channel layer, for example, by CVD.

Next, in step S03, an oxide semiconductor layer is formed. The oxide semiconductor layer is patterned, for example, by photolithography, wet etching, and resist removal and cleaning.

Figure 5A:
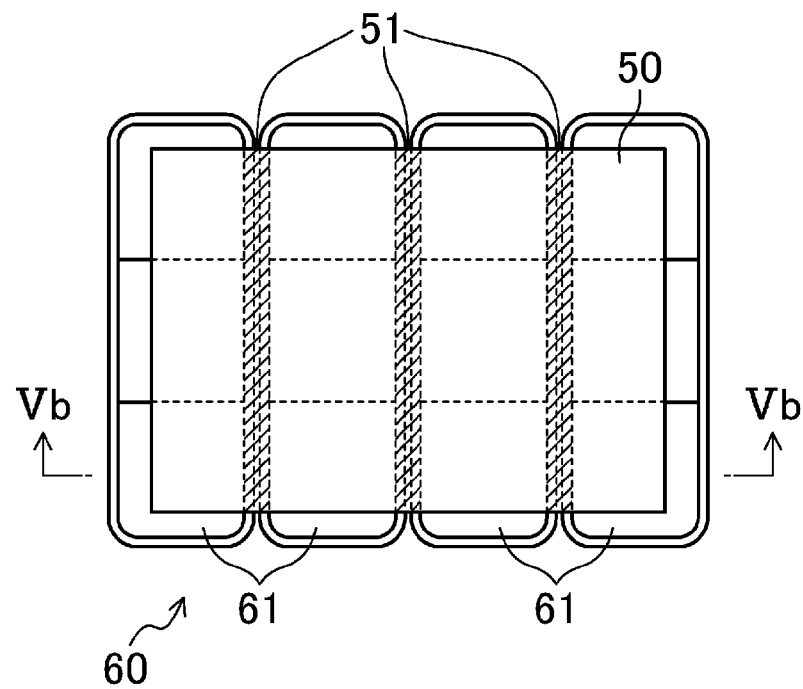
Figure 5B:
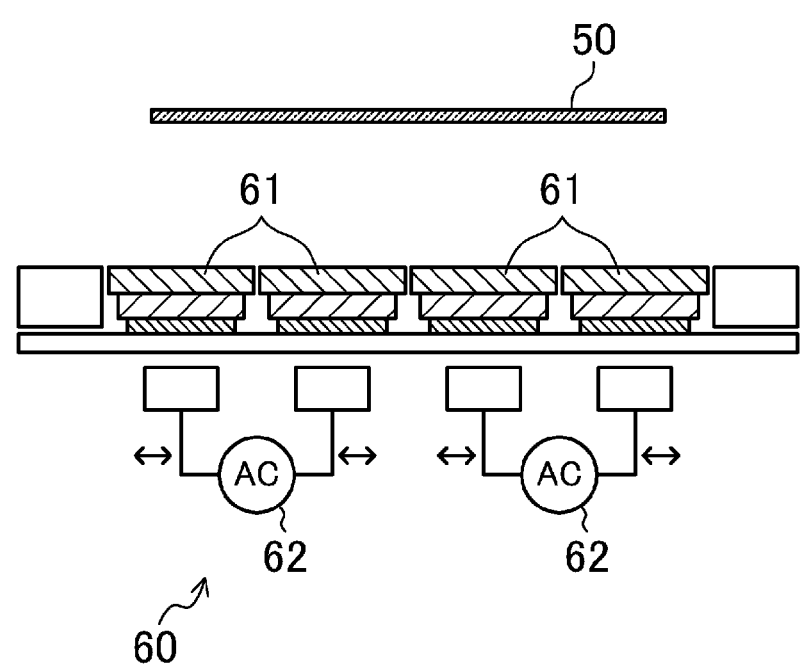
Figure 6:
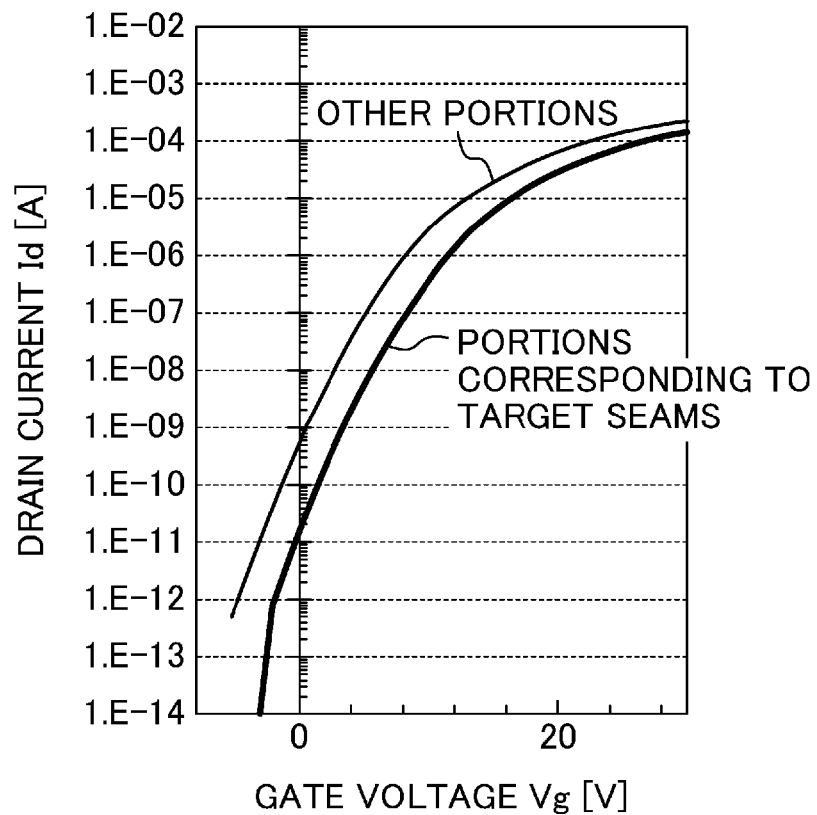
FIG. 6 is a graph illustrating the substrate characteristics after AC sputtering.

Next, in step S04, signal lines and drain electrodes are formed. A titanium film that is a lower film and an aluminum film that is an upper film are deposited, for example, by AC sputtering, and then, the films are patterned by photolithography, dry etching, and resist removal and cleaning to form the signal lines and the drain electrodes made of the aluminum/titanium multilayer film. Here, an AC sputtering device 60 will be briefly described. As illustrated in FIGS. 5A and 5B, in AC sputtering, alternating voltages 62 having different polarities are applied to pairs of targets 61 arranged in parallel, and sputtered atoms from the targets 61 are deposited on the substrate 50 opposed to the targets 61 to form a metal film. With increasing size of the substrate 50, a plurality of targets 61 are required, and as illustrated by hatching in FIG. 5A, the substrate 50 has portions 51 corresponding to target seams between adjacent ones of targets. The quality of a portion of the film located on the portions 51 of the substrate corresponding to the target seams is different from that of a portion of the film located on the other portions of the substrate immediately above the targets 61, and a function of the drain current Id and gate voltage Vg of the portions 51 corresponding to the target seams is significantly different from that of the other portions as illustrated in FIG. 6. Such a difference in performance deteriorates the substrate quality.

Next, in step S05, a protective film is formed. A $SiO_2$ film is deposited on the substrate 50, for example, by CVD.

Next, in step S06, annealing according to the present disclosure is performed. Specifically, the interior of a device body 3 is kept at 350° C., and a given amount of wet oxygen gas, e.g., 250 liters of wet oxygen gas per minute, is fed from a bubbler system 12 through an oxygen addition gas feed pipe 8 into chambers 5. The wet oxygen gas fed into the chambers 5 is ejected through jet nozzles 16 to the portions 51 of the substrate 50 corresponding to the target seams. The substrate 50 is heated, for example, for one hour. The portions 51 of the substrate 50 corresponding to the target seams and formed by AC sputtering deposition vary in performance, and are oxygen deficient; however, while the wet oxygen gas is ejected to the portions 51 corresponding to the target seams, the substrate 50 is heated, and thus, oxidation of the portions 51 corresponding to the target seams is accelerated to eliminate variations in performance and provide uniform performance. The gas in the chambers 5 is discharged through gas exhaust pipes 11, and thus, the internal pressures of the chambers 5 are not much higher than atmospheric pressure. Since oxidation can be performed at about 350° C., this eliminates the need for using quartz that has high heat resistance and is difficult to be machined into a large member, and thus, the device body 3 can be made of metal. The interiors of the chambers 5 are not filled with a larger amount of wet oxygen gas than necessary, and thus, no leakage current arises from far-infrared plane heaters 6.

Next, in step S07, an interlayer insulating film is formed. For example, a photosensitive interlayer insulating film material is patterned by photolithography, and then, the protective film and the insulating film are patterned by dry etching.

Next, in step S08, pixel electrodes are formed. An ITO film is deposited, for example, by sputtering, and then, the ITO film is patterned by photolithography, wet etching, and resist removal and cleaning to form the pixel electrodes made of the ITO film.

Finally, in step S09, the substrate 50 and a color filter substrate fabricated through another process are bonded together to form panels. For example, polyimide is formed, as an alignment film, on each of the active matrix substrate 50 fabricated through the process steps and the counter substrate by printing. Subsequently, a sealant is formed on each of the substrates by printing, liquid crystal material is dropped onto the substrate, and the substrates are then bonded together. Finally, the bonded substrates are partitioned by dicing.

—Comparison Between Annealing Using Wet Oxygen Gas and Annealing Using Atmospheric Gas—

Next, comparison results between annealing using a wet oxygen gas and annealing using atmospheric gas will be briefly described.

First, two substrates 50 on which in step S04, the signal lines and the drain electrodes have been formed were prepared, and the substrates 50 were annealed under the following conditions.

Example

In the oxidation annealing device 1, while 250 liters of wet oxygen gas per minute were fed to one of the substrates 50 at a temperature of 350° C., the wet oxygen gas was ejected through the jet nozzles 16 to the substrate 50, and the substrate 50 was heated for one hour.

Comparative Example

In a device similar to the oxidation annealing device 1, dry air having a temperature of 350° C. was fed into the chambers 5, and the other substrate 50 was heated for one hour.

Figure 7:
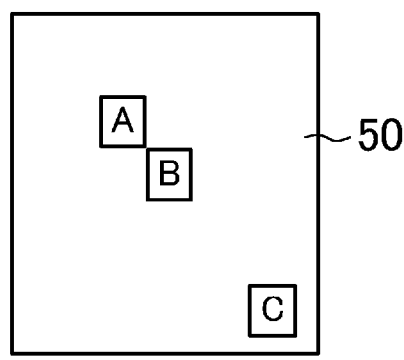
FIG. 7 is a plan view illustrating the layout of regions of a substrate.
Figures 8, 9:
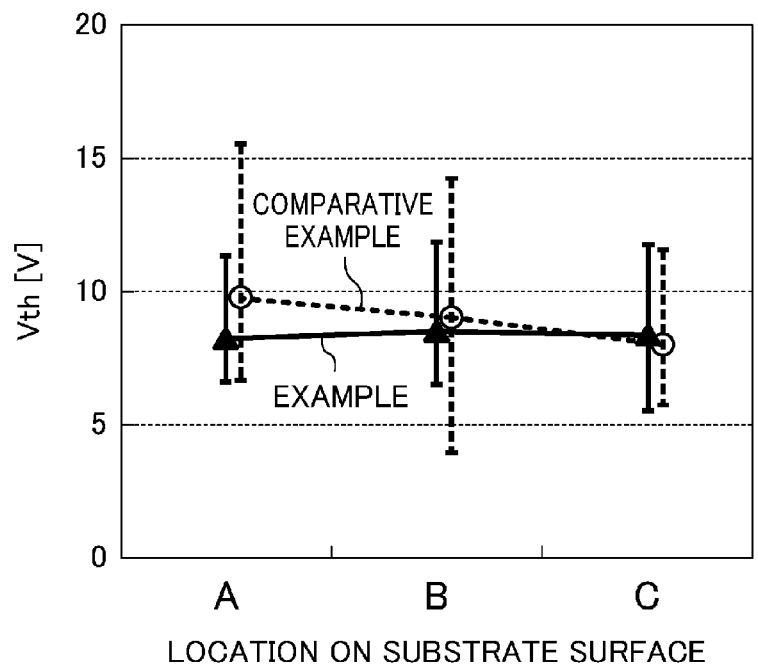
FIG. 8 is a graph illustrating the distribution of the threshold voltages of the regions.
FIG. 9 is a table illustrating, for comparison, the average of the threshold voltages of portions of a substrate corresponding to seams between adjacent ones of targets and the average of the threshold voltages of portions of the substrate except the portions corresponding to the target seams in each of the regions, and the average of the threshold voltages of the regions.

FIGS. 8 and 9 illustrate results obtained by comparing the degrees of difference in threshold voltage Vth between the portions 51 of each of the two annealed substrates 50 corresponding to the target seams and portions of each of the substrates except the portions 51 among regions A-C illustrated in FIG. 7.

Specifically, FIG. 8 illustrates the distribution of the threshold voltages of the regions of each of the example and the comparative example. FIG. 9 illustrates the average of the threshold voltages of the portions 51 corresponding to the target seams and the average of the threshold voltages of the portions except the portions 51 on each of the regions, and also illustrates the average of the threshold voltages of the portions 51 on the regions and the average of the threshold voltages of the portions except the portions 51 on the regions.

The experimental data showed that in the example, the range of variation in threshold voltage is smaller than that in the comparative example, and the difference in threshold voltage between the portions 51 corresponding to the target seams and the portions except the target seams is also smaller than that in the comparative example, resulting in the performance difference reduced.

Therefore, in this embodiment, a large substrate 50 can be also treated by oxidation annealing at high throughput and low cost, and a leakage current can be simultaneously prevented.

—First Variation of Embodiment—

Figure 10:
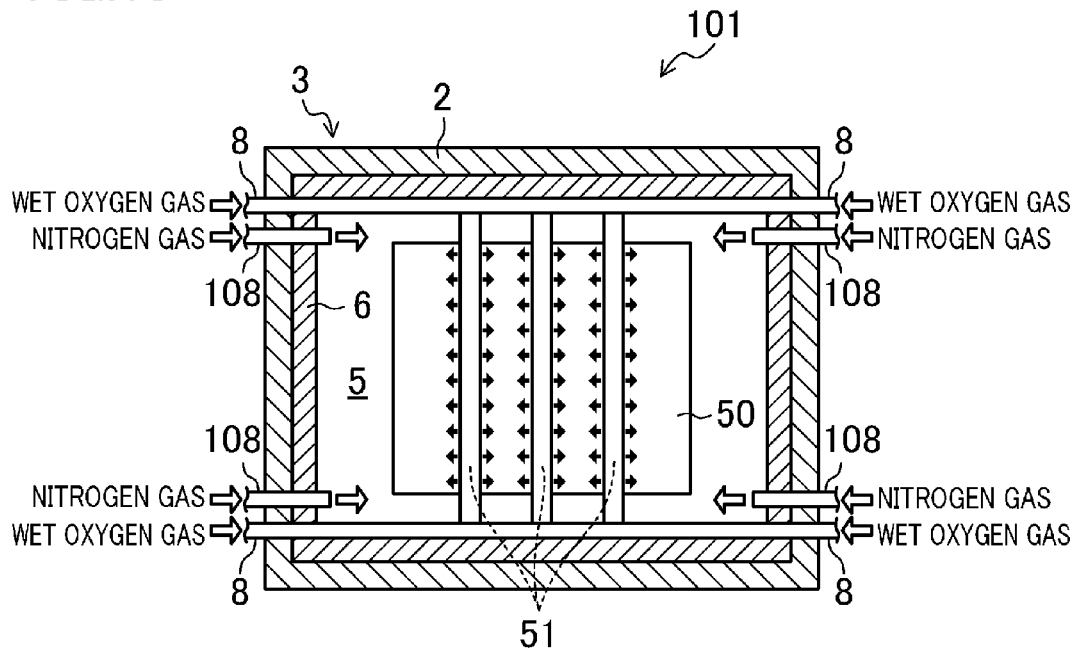
FIG. 10 is a diagram that corresponds to a first variation of the embodiment and is equivalent to FIG. 2.

FIG. 10 illustrates an oxidation annealing device 101 according to a first variation of the embodiment of the present disclosure, and unlike the embodiment, the interior of a device body 3 is filled with a nitrogen gas. In the following variations, the same reference characters are used to represent the same elements as those in FIGS. 1-9, and the detailed explanation thereof is omitted.

Specifically, in this variation, a nitrogen gas feed pipe 108 configured to fill a space in a device body 3 with a nitrogen gas is added to the device of the embodiment. A nitrogen gas source, such as a nitrogen gas tank, is connected to the nitrogen gas feed pipe 108. Instead of the nitrogen gas, a gas serving to reduce oxidation can be used.

In this variation, similar to the embodiment, an oxygen addition gas containing water vapor and oxygen is locally ejected into chambers 5 with the interiors of the chambers 5 filled with a nitrogen gas.

Thus, the oxygen addition gas containing water vapor and oxygen is ejected through jet nozzles 16 only to oxygen-deficient portions of a substrate 50 (portions 51 of the substrate 50 corresponding to target seams), thereby accelerating oxidation. However, since the interior of the device body 3 is filled with nitrogen, this reduces oxidation of a portion of the substrate 50 that does not require oxygen, and prevents the interior of the device body 3 from being filled with a larger amount of water vapor than necessary, thereby reducing the leakage current from far-infrared plane heaters 6 (electrical breakdown).

Therefore, also in this variation, a large substrate 50 can be also treated by oxidation annealing at high throughput and low cost, and a leakage current can be simultaneously prevented.

—Second Variation of Embodiment—

Figure 11:
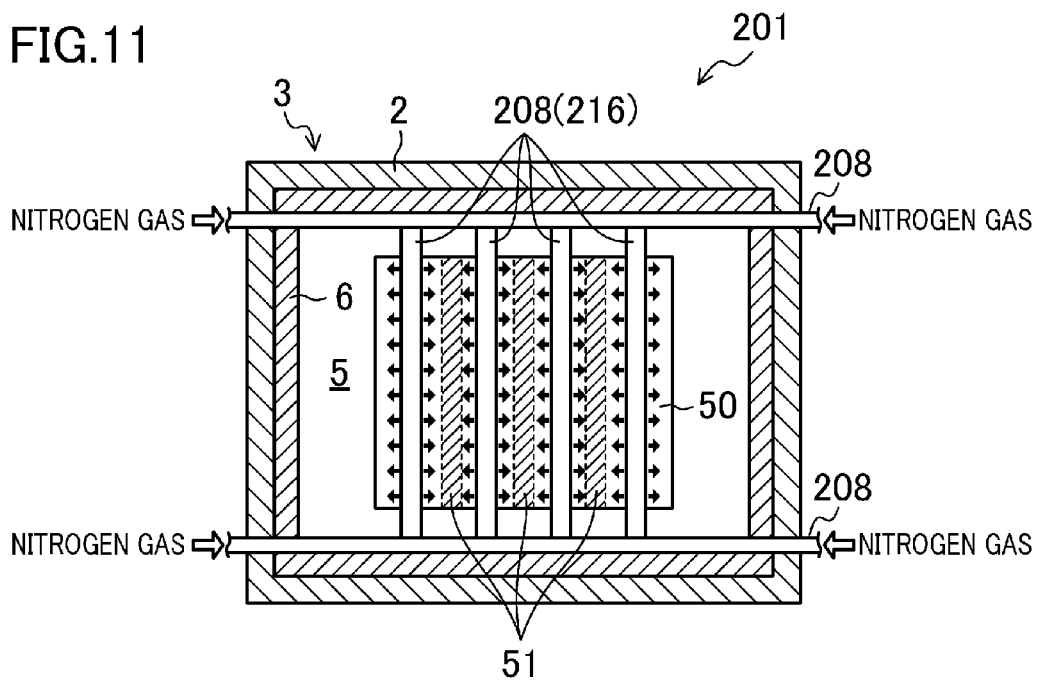
FIG. 11 is a diagram that corresponds to a second variation of the embodiment and is equivalent to FIG. 2.

FIG. 11 illustrates an oxidation annealing device 201 according to a second variation of the embodiment of the present disclosure, and unlike the embodiment, nitrogen is ejected to portions 51 of a substrate corresponding to target seams.

Specifically, in this variation, the oxygen addition gas feed pipe 8 of the embodiment is replaced with a nitrogen gas feed pipe 208 through which a nitrogen gas is fed into a device body 3. Instead of a bubbler system 12, a nitrogen gas source, such as a nitrogen gas tank, is connected to the nitrogen gas feed pipe 208. Instead of the nitrogen gas, a reducing gas, such as a hydrogen gas or a carbon monoxide gas, can be used as long as the reducing gas serves to reduce oxidation. A method in which the interior of the device body 3 is heated under vacuum to reduce oxidation cannot be utilized, because the device becomes complicated.

Jet nozzles 216 are connected to the nitrogen gas feed pipe 208 to eject a nitrogen gas to oxygen-excessive portions of the substrate 50 (portions thereof except the portions 51 corresponding to the target seams). However, this variation is different from the embodiment in terms of the locations at which the jet nozzles 216 are disposed or the directions in which the nitrogen gas is ejected through the jet nozzles 216. For example, as illustrated in FIG. 11, the jet nozzles 216 are directed to the portions except the portions 51 corresponding to the target seams.

Similar to the embodiment, in annealing, the annealing device is used to locally eject a nitrogen gas to the portions of the substrate 50 except the portions 51 corresponding to the target seams while heating the substrate 50 in the device body 3 using the far-infrared plane heaters 6.

Unlike the embodiment, a nitrogen gas serving to reduce oxidation is ejected through the jet nozzles 216 only to the oxygen-excessive portions of the substrate 50 to provide uniform oxidation of the entire substrate 50. In this method, the interior of the device body 3 is not filled with water vapor, thereby reducing the leakage current from the far-infrared plane heaters 6 (electrical breakdown). The nitrogen gas needs to be brought into contact with only the oxygen-excessive portions, the interior of the device body 3 does not need to be entirely and uniformly filled with the nitrogen gas, and thus, high hermeticity is not required. This allows vapor oxidation annealing of a large substrate 50.

Therefore, also in this variation, a large substrate 50 can be also treated by oxidation annealing at high throughput and low cost, and a leakage current can be simultaneously prevented.

Other Embodiments

The embodiment of the present disclosure may be configured as follows.

Specifically, although, in the embodiment, annealing is performed after the formation of a protective film in step S05, annealing may be performed after the formation of an oxide semiconductor layer in step S03.

The above embodiments are set forth merely for the purposes of preferred examples in nature, and are not intended to limit the scope of applications and use of the invention.

INDUSTRIAL APPLICABILITY

As described above, the present disclosure is useful for oxidation annealing devices configured to heat and oxidize a substrate, and methods for fabricating a thin film transistor using oxidation annealing.

DESCRIPTION OF REFERENCE CHARACTERS

1 OXIDATION ANNEALING DEVICE
3 DEVICE BODY
6 FAR-INFRARED PLANE HEATER (MICA HEATER, FLAT INFRARED RADIATION PLATE)
8 OXYGEN ADDITION GAS FEED PIPE
11 GAS EXHAUST PIPE
16 JET NOZZLE
50 SUBSTRATE
51 PORTION OF SUBSTRATE CORRESPONDING TO TARGET SEAM
60 AC SPUTTERING DEVICE
61 TARGET
101 OXIDATION ANNEALING DEVICE
108 NITROGEN GAS FEED PIPE
201 OXIDATION ANNEALING DEVICE
208 NITROGEN GAS FEED PIPE

The invention claimed is:

1. An oxidation annealing device, comprising:
a device body formed in a shape of a closed container;
a far-infrared plane heater placed in the device body;
an oxygen addition gas feed pipe through which an oxygen addition gas containing water vapor and oxygen is fed into the device body;
a gas exhaust pipe through which gas in the device body is discharged; and
jet nozzles that are brought into communication with the oxygen addition gas feed pipe and through which the oxygen addition gas containing water vapor and oxygen is ejected to an oxygen-deficient portion of a substrate; wherein
the substrate corresponds to a thin film transistor, and
the oxygen-deficient portion is a portion of the substrate corresponding to a seam between targets and formed by AC sputtering.

2. The oxidation annealing device of claim 1, further comprising:
a nitrogen gas feed pipe configured to fill a space in the device body with a nitrogen gas, wherein
the oxygen addition gas is ejected through the jet nozzles with the device body filled with the nitrogen gas.

3. The oxidation annealing device of claim 1, wherein
the seam includes a plurality of seams, and
the jet nozzles are arranged depending on the number of the seams.

4. The oxidation annealing device of any one of claim 1, wherein
the far-infrared plane heater includes a mica heater and a flat infrared radiation plate.

* * * * *